US008520390B2

(12) United States Patent
Okamoto et al.

(10) Patent No.: US 8,520,390 B2

(45) Date of Patent: Aug. 27, 2013

(54) MECHANICAL ISOLATION AND THERMAL CONDUCTIVITY FOR AN ELECTRO-MAGNETIC DEVICE

(75) Inventors: Douglas Seiji Okamoto, San Carlos, CA (US); Timothy J Dasilva, San Jose, CA (US); Louis Ray Pledger, Jr., Placerville, CA (US)

(73) Assignee: Microsemi Corporation, Aliso Viejo, CA (US)

( * ) Notice: Subject to any disclaimer, the term of this patent is extended or adjusted under 35 U.S.C. 154(b) by 357 days.

(21) Appl. No.: 13/074,031

(22) Filed: Mar. 29, 2011

(65) Prior Publication Data

US 2011/0242767 A1 Oct. 6, 2011

Related U.S. Application Data

(60) Provisional application No. 61/320,710, filed on Apr. 3, 2010.

(51) Int. Cl.
*H05K 7/20* (2006.01)

(52) U.S. Cl.
USPC ................... 361/709; 361/679.34; 360/99.16; 174/544; 174/548

(58) Field of Classification Search
USPC .............. 361/46–679.54, 688–690, 701–722, 361/752
See application file for complete search history.

(56) References Cited

U.S. PATENT DOCUMENTS

| | | | | |
|---|---|---|---|---|
| 3,576,503 | A | 4/1971 | Hanson | |
| 4,334,201 | A | 6/1982 | Shores | |
| 4,651,116 | A | 3/1987 | Schloemann | |
| 4,758,926 | A | 7/1988 | Herrell | |
| 5,587,855 | A * | 12/1996 | Kim | 360/99.16 |
| 5,679,457 | A | 10/1997 | Bergerson | |
| 5,930,115 | A | 7/1999 | Tracy | |
| 5,959,513 | A * | 9/1999 | Parrott et al. | 333/219.2 |
| 6,119,573 | A | 9/2000 | Berens | |
| 6,151,216 | A * | 11/2000 | Vos et al. | 361/704 |
| 6,320,723 | B1 * | 11/2001 | Bernett | 360/97.13 |
| 6,501,644 | B1 * | 12/2002 | Silverman et al. | 361/679.34 |
| 2004/0032710 | A1 * | 2/2004 | Fujiwara et al. | 361/685 |
| 2008/0009187 | A1 * | 1/2008 | Grimm et al. | 439/595 |

* cited by examiner

*Primary Examiner* — Courtney Smith
(74) *Attorney, Agent, or Firm* — Simon Kahn

(57) ABSTRACT

An electro-magnetic device assembly constituted of an electro-magnetic device; a chassis arranged to sink heat; at least one thermally conductive material in thermal communication with the electro-magnetic device and with the chassis; and at least one mechanically isolating material in contact with the thermally conductive material and with the chassis, the at least one mechanically isolating material arranged to dampen the transmission of vibrations experienced by the chassis, in the direction of the magnetic field of the electro-magnetic device, to the electro-magnetic device.

14 Claims, 7 Drawing Sheets

MECHANICAL ISOLATION AND THERMAL CONDUCTIVITY FOR AN ELECTRO-MAGNETIC DEVICE

CROSS-REFERENCE TO RELATED APPLICATION

This application claims priority from U.S. Provisional Patent Application Ser. No. 61/320,710 filed Apr. 3, 2010, entitled "Method for Mechanical Isolation and Thermal Conductivity in a YIG Device", the entire contents of which are incorporated herein by reference.

TECHNICAL FIELD

The present invention relates to the field of mechanical isolation, and more particularly to a means for providing mechanical isolation with improved thermal transfer characteristics.

BACKGROUND

Yttrium-iron-garnet (YIG) spheres are used in high frequency filter, oscillator and other devices that are tuned to a resonant frequency by a magnetic field. Thus, a YIG device is a filter, oscillator, parametric amplifier, or other device that uses a YIG crystal in combination with a variable magnetic field to achieve wide-band tuning. YIG devices advantageously exhibit a high resonant frequency, a wide tuning range, linear tuning characteristics and spectral purity. YIG devices are typically supplied as a YIG sphere placed in a magnetic circuit, such as a gap between two magnetic pole faces. The resonant frequency is a function of the location of the YIG sphere, and under static conditions the gap from the YIG sphere to the magnetic field source is fixed. However, in a vibrating environment small dynamic mechanical distortions occur in the YIG device resulting in changes in the resonant frequency of the YIG device. The YIG device is particularly sensitive to vibrations experienced in the axis of the magnetic field, and in certain embodiments particularly so in the central portion of the device. The shifts in resonant frequency result in high frequency signal degradation, such as phase noise degradation. The resonant frequency may further drift with temperature, and thus heat generated by a YIG device must be channeled away to prevent resonant frequency drift.

In order to prevent vibration of the YIG device, a mechanically isolating material such as a cellular silicone may be used to mount the YIG device, resulting in less mechanical energy being transmitted to the YIG device, thus reducing signal degradation. Experiments performed by the inventors show that about a 20 dB reduction in phase noise degradation at a 1 KHz offset from the carrier and 10 dB reduction at 10 KHz offset is achieved by mounting the YIG device in a cellular silicone with a compression force deflection at 25% deflection of less than 5 pounds per square inch (PSI).

Unfortunately, typically good mechanical isolation results in poor thermal conductivity between the YIG device and the enclosure for the YIG device. As indicated above, the YIG device changes exhibits an uncontrolled increase in temperature in the absence of good thermal conduction, resulting in undesired electrical performance, particularly resonance frequency drift, damage, and decreased operating lifespan.

U.S. Pat. No. 4,651,116 issued Mar. 17, 1987 to Schloemann, the entire contents of which is incorporated herein by reference, is addressed to a vibration insensitive magnetically tuned resonant circuit comprising a nonmagnetic collar or a combination of a raised peripheral edge portion and a raised central inner portion. The requirement for additional structures within the YIG device adds to cost, and does not allow for the selection of commercially available YIG devices.

U.S. Pat. No. 4,758,926 issued Jul. 19, 1988 to Herrel et al., the entire contents of which is incorporated herein by reference, is addressed to a fluid-cooled integrated circuit package. The requirement for a cooling fluid adds to cost, and may not be feasible in many deployments. Furthermore, fluid cooling does not address the issue of vibration.

U.S. Pat. No. 5,930,115 issued Jul. 27, 1999 to Tracy et al., the entire contents of which is incorporated herein by reference, is addressed to an apparatus, method and system for thermal management of a semiconductor device. The mechanical isolation described is arranged to prevent physical contact and resultant damage to an unpackaged semiconductor die mounted directly on a printed circuit substrate, and thus is ineffective for mechanically isolating a YIG device from vibration of the enclosure surrounding the YIG device.

The above has been detailed in relation to a YIG device, however this is not meant to be limiting in any way, and is equally applicable to any electro-magnetic device which generates heat and is variant responsive to changing mechanical forces.

What is desired, and not supplied by the prior art, is a means for mechanically isolating an electro-magnetic device from changing mechanical forces experienced by a surrounding chassis while providing good thermal management of the electro-magnetic device.

SUMMARY

In view of the discussion provided above and other considerations, the present disclosure provides methods and apparatus to overcome some or all of the disadvantages of prior and present mounting schemes. Other new and useful advantages of the present methods and apparatus will also be described herein and can be appreciated by those skilled in the art.

This is provided in certain embodiments by a stacked combination of thermally conductive material and mechanically isolating material, the thermally conductive material in thermal communication with the electro-magnetic device and further in thermal communication with a heat sink, such as a chassis. The mechanically isolating material is arranged to absorb changing mechanical forces in at least one direction. Preferably the thermally conductive material exhibits properties of mechanical isolation, thus aiding in the absorption of forces.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION OF PREFERRED EMBODIMENTS

Figure 1A:
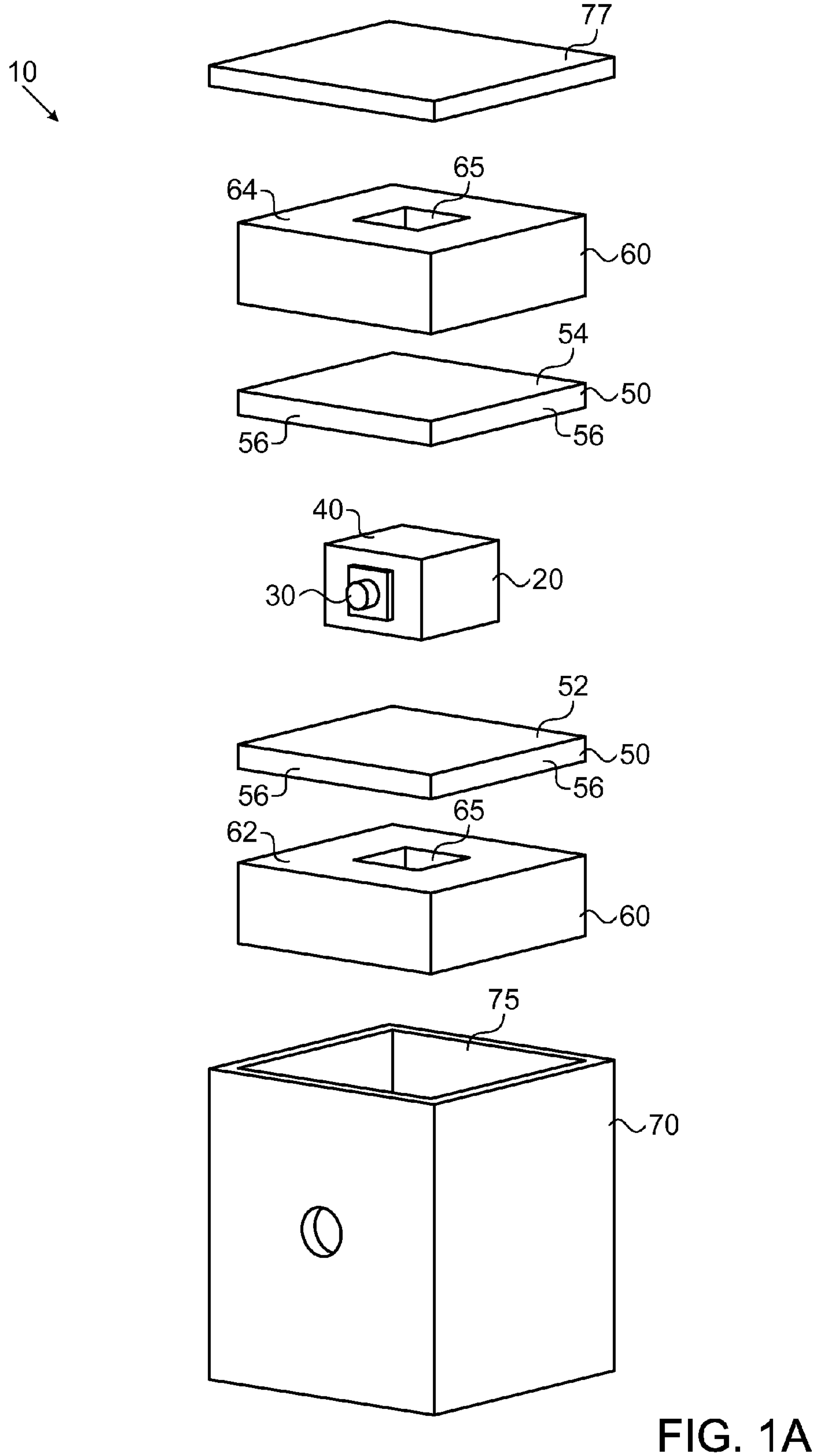
FIGS. 1A-1F illustrate various views of an exemplary embodiment of an electro-magnetic device assembly wherein thermally conductive material is provided in thermal communication with opposing faces of an electro-magnetic device, and mechanically isolating material is provided in contact with the thermally conductive material and with a chassis.

Before explaining at least one embodiment in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

A thermally conductive material is defined herein as a material that exhibits thermal conductivity in excess of 0.5 watts per Kelvin-meter, normally expressed as 0.5 W/m-K. A mechanically isolating material is defined herein as a material exhibiting a hardness of either: no more than 10 durometers on the Shore A scale, or a compression force deflection at 25% deflection of less than 5 pounds per square inch (PSI). While these 2 terms are not identical, most materials are specified variously to one of the above specifications.

Figure 1B:
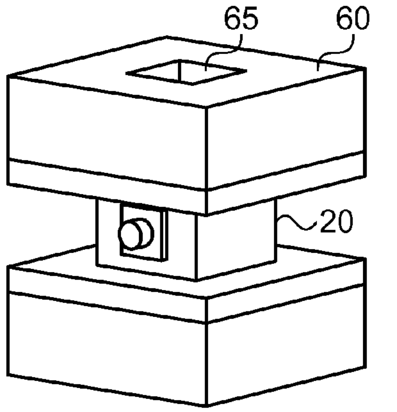
Figure 1C:
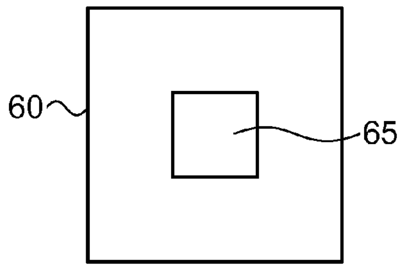
Figure 1D:
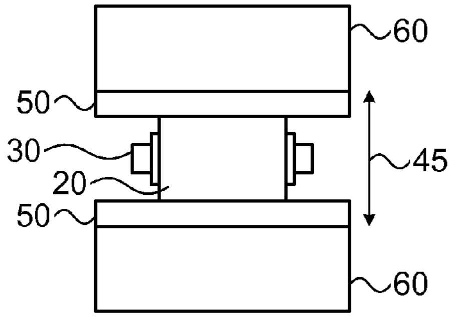
Figure 1E:
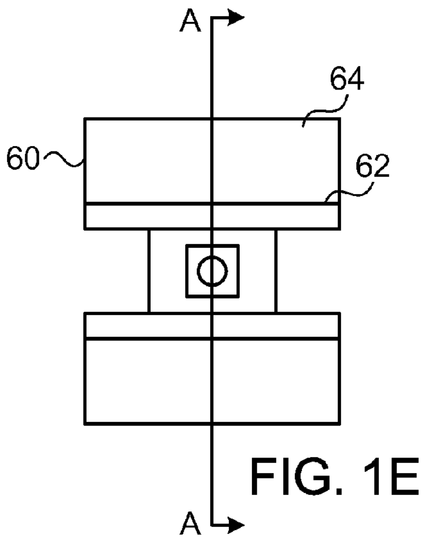
Figure 1F:
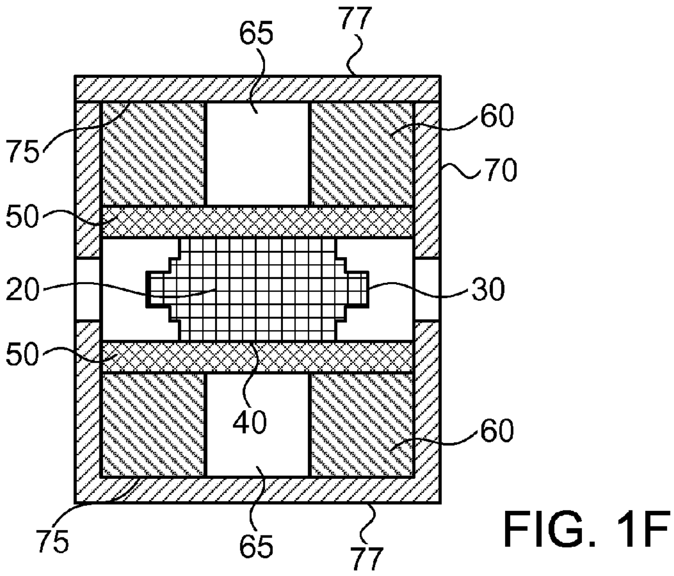

FIGS. 1A-1F illustrate various views of an exemplary embodiment of an electro-magnetic device assembly 10 comprising: an electro-magnetic device 20 exhibiting a first and a second connector 30, a first and a second face 40 and a magnetic field axis 45; a first and a second thermally conductive material 50, each exhibiting a first face 52, a second face 54 and a plurality of ends 56; a first and a second mechanically isolating material 60, each exhibiting a first face 62 and a second face 64 and an inset 65; and a chassis 70, exhibiting a plurality of inner walls 75 and a top and a bottom wall 77. Walls 77 are described as top and bottom walls 77, however this is not meant to be limiting in any way and chassis 70 can be provided in any orientation without exceeding the scope. In further detail, FIG. 1A illustrates an exploded view of electro-magnetic device assembly 10 with chassis 70 removed, FIG. 1B illustrates an isometric view of electro-magnetic device assembly 10; FIG. 1C illustrates a top view of electro-magnetic device assembly 10 with chassis 70 removed, the top view being identical with a bottom view; FIG. 1D illustrates a side view of electro-magnetic device assembly 10 with chassis 70 removed; FIG. 1E illustrates a front view of electro-magnetic device assembly 10 with chassis 70 removed; and FIG. 1F illustrates a view of section A-A of FIG. 1E particularly showing chassis 70, the various views of FIGS. 1A-1F being taken together for ease of understanding.

Electro-magnetic device 20 is illustrated as a box shaped device, with a opposing faces 40 larger than each of the side walls connecting opposing faces 40, however this in not meant to be limiting in any way. First and second connectors 30 appear on opposing side walls of electro-magnetic device 20, however this is not meant to be limiting in any way. In one embodiment (not shown), electrical connections appear on a side wall of electro-magnetic device 20 where no connector 30 appears, however this is not meant to be limiting in any way. Magnetic field axis 45 is orthogonal to faces 40.

First thermally conductive material 50, illustrated as a uniform sheet, without limitation, is arrayed to be in thermal communication with first face 40. In one embodiment, a portion of first face 52 of first thermally conductive material 50 is in direct contact with first face 40 of electro-magnetic device 20. In another embodiment, a thermally conductive adhesive or gel is interposed between first face 40 of electro-magnetic device 20 and first face 52 of first thermally conductive material 50. Ends 56 of first thermally conductive material 50 are in thermal communication with chassis 70. In one embodiment ends 56 are in direct contact with an inner wall 75 of chassis 70, and in another embodiment a thermally conductive adhesive or gel is interposed between ends 56 and inner wall 75 of chassis 70. There is no requirement that first thermally conductive material 50 be in thermal communication with the entire surface area of first face 40, and in one embodiment (not shown) first thermally conductive material 50 is in thermal communication with only a portion of first face 40. Preferably first thermally conductive material 50 is in thermal communication with a major portion of first face 40.

Second thermally conductive material 50, illustrated as a uniform sheet, without limitation, is arrayed to be in thermal communication with second face 40. In one embodiment a portion of first face 52 of second thermally conductive material 50 is in direct contact with second face 40 of electro-magnetic device 20. In another embodiment, a thermally conductive adhesive or gel is interposed between second face 40 of electro-magnetic device 20 and first face 52 of second thermally conductive material 50. Ends 56 of second thermally conductive material 50 are in thermal communication with chassis 70. In one embodiment ends 56 are in direct contact with an inner wall 75 of chassis 70, and in another embodiment a thermally conductive adhesive or gel is interposed between ends 56 and inner wall 75 of chassis 70. There is no requirement that second thermally conductive material 50 be in thermal communication with the entire surface area of second face 40, and in one embodiment (not shown) second thermally conductive material 50 is in thermal communication with only a portion of second face 40. Preferably second thermally conductive material 50 is in thermal communication with a major portion of second face 40.

Heat generated by electro-magnetic device 20 is advantageously transmitted by first and second thermally conductive material 50 to chassis 70, to be dissipated thereby. Chassis 70 is preferably constituted of a metal secured to a heat sinking platform (not shown).

First mechanically isolating material 60, illustrated as a block with inset 65 punched from first face 62 to second face 64 thereof, without limitation, is arrayed to be in mechanical communication with second face 54 of first thermally conductive material 50 and further to be in mechanical communication with chassis 70. In one embodiment, a portion of first face 62 of first mechanically isolating material 60 is in direct contact with second face 54 of first thermally conductive material 50. In another embodiment, an adhesive, such as an acrylic adhesive, is supplied on first face 62 so as to secure first face 62 to second face 54 of first thermally conductive material 50. Second face 64 of first mechanically isolating material 60 is in mechanical communication with inner wall 75 of chassis 70. In one embodiment, top wall 77 of chassis 70 is substantially parallel to first face 40 of electro-magnetic device 20, extending past the various edges of first face 40. In one embodiment second face 64 of first mechanically isolating material 60 is in direct contact with inner wall 75 of top wall 77. In another embodiment, an adhesive, such as an acrylic adhesive, is supplied on second face 64 so as to secure second face 64 to inner wall 75 of top wall 77.

Second mechanically isolating material 60, illustrated as a block with inset 65 punched from a first face 62 to a second face 64 thereof, without limitation, is arrayed to be in mechanical communication with second face 54 of second thermally conductive material 50 and further to be in mechanical communication with chassis 70. In one embodiment a portion of first face 62 of second mechanically isolating material 60 is in direct contact with second face 54 of second thermally conductive material 50. In another embodiment, an adhesive, such as an acrylic adhesive, is supplied on first face 62 so as to secure first face 62 to second face 54 of second thermally conductive material 50. Second face 64 of second mechanically isolating material 60 is in mechanical communication with inner wall 75 of chassis 70. In one embodiment, bottom wall 77 of chassis 70 is substantially parallel to second face 40 of electro-magnetic device 20, extending past the various edges of second face 40. In one embodiment, second face 64 of second mechanically isolating material 60 is in direct contact with inner wall 75 of bottom wall 77. In another embodiment, an adhesive, such as an acrylic adhesive, is supplied on second face 64 so as to secure second face 64 to inner wall 75 of bottom wall 77.

Chassis 70 is formed as a container surrounding electro-magnetic device 20, thermally conductive materials 50 and mechanically isolating materials 60. Openings, as required, are made to enable contact with connectors 30 and any electrical connections.

Vibrations experienced by chassis 70 in the direction of magnetic field axis 45 are dampened by the low compression force deflection of first and second mechanically isolating materials 60, and thus vibration experienced by electro-magnetic device 20 is reduced. Insets 65 each mechanically isolate a central portion of a respective face 40 from vibrations of inner wall 75 of top and bottom walls 77, respectively, as vibrations are transmitted, in a dampened format, by the remaining portion of first and second mechanically isolating material 60. Advantageously, each inset 65 thus further mechanically isolates a particular sensitive area of the respective face 40 from vibrations experienced by chassis 70. In one non-limiting embodiment, each inset 65 is dimensioned to be directly over the central ⅓ of the respective face 40.

Each of first and second thermally conductive materials 50 preferably exhibits a hardness of less than 10 durometers so as to dampen the transmission of vibrations experienced by chassis 70, in the direction of magnetic field axis 45, which are not absorbed by mechanically isolating materials 60, to electro-magnetic device 20. In one non-limiting embodiment, first and second thermally conductive materials 50 are each constituted of a "gel-like" modulus material having a thermal conductivity of about 1.0 W/m-K. Such a material is commercially available from The Bergquist Company of Chanhassen, Minn.

First and second mechanically isolating materials 60 each preferably exhibit a compression force deflection at 25% deflection of less than 5 PSI, and in one embodiment exhibit a compression force deflection at 25% deflection of about 3 PSI. In one particular embodiment, first and second thermally mechanically isolating materials 60 are each constituted of a cellular silicone exhibiting: a compression force deflection at 25% deflection of about 3 PSI, a density of about 208 $kg/m^3$ and a thermal conductivity of 0.06 W/m-K. Such a material is commercially available from the Rogers Corporation of Rogers, Conn.

Figure 2A:
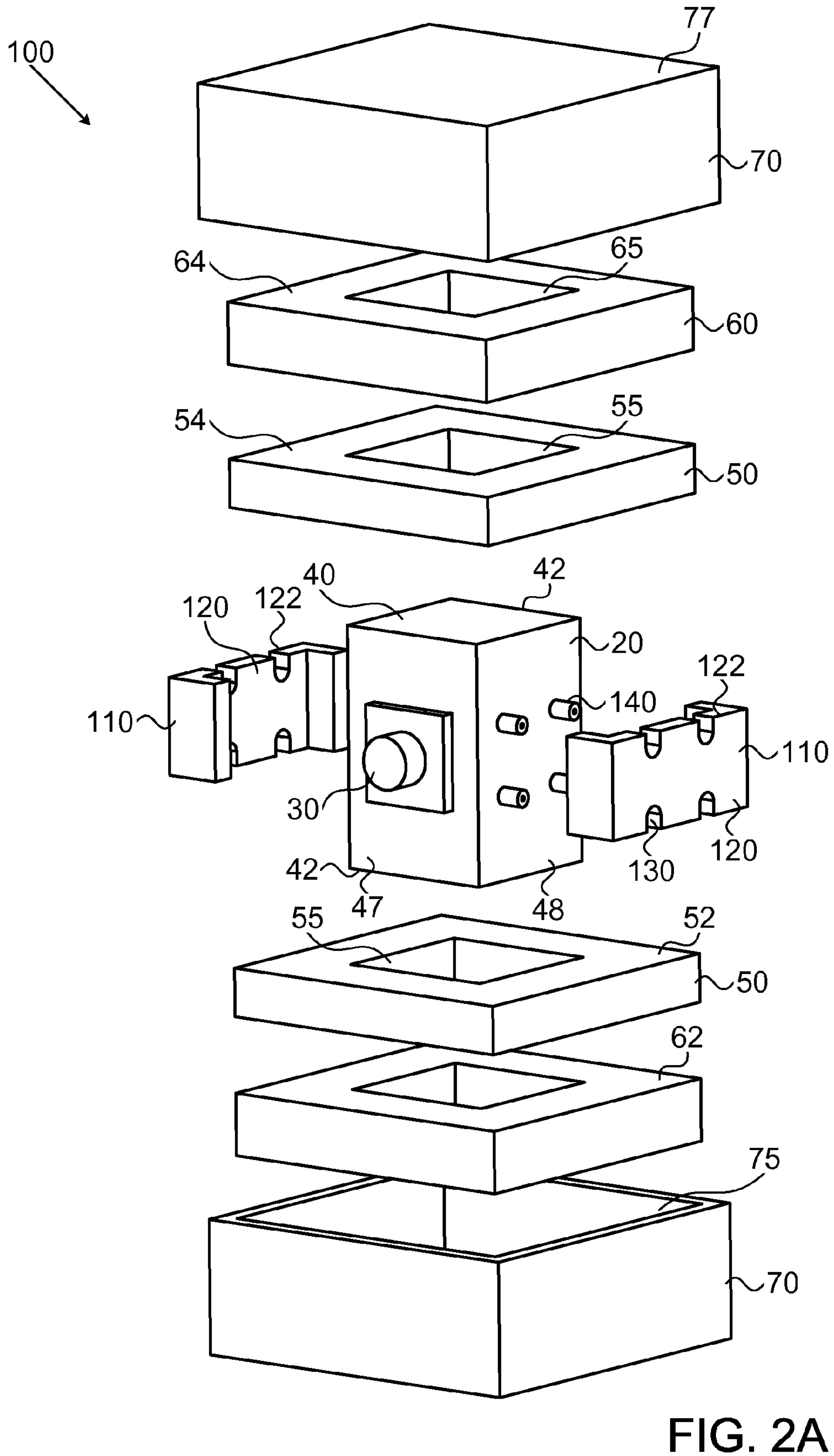
FIGS. 2A-2E illustrate various views of an exemplary embodiment of an electro-magnetic device assembly wherein thermally conductive material is provided in thermal communication with a bracket, the bracket secured and in thermal communication with an electro-magnetic device, and mechanically isolating material is provided in contact with the thermally conductive material and with a chassis.
Figure 2B:
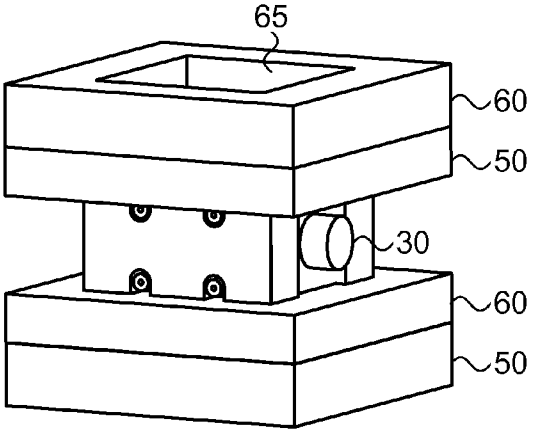
Figure 2C:
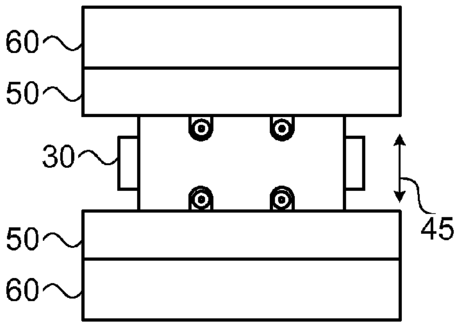
Figure 2D:
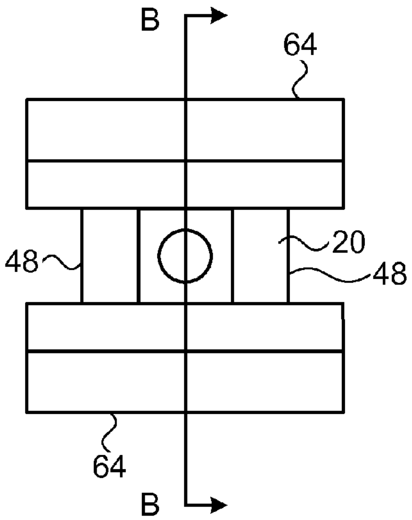
Figure 2E:
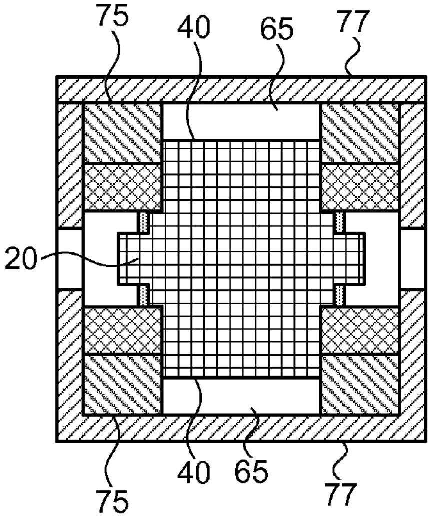
Figure 3A:
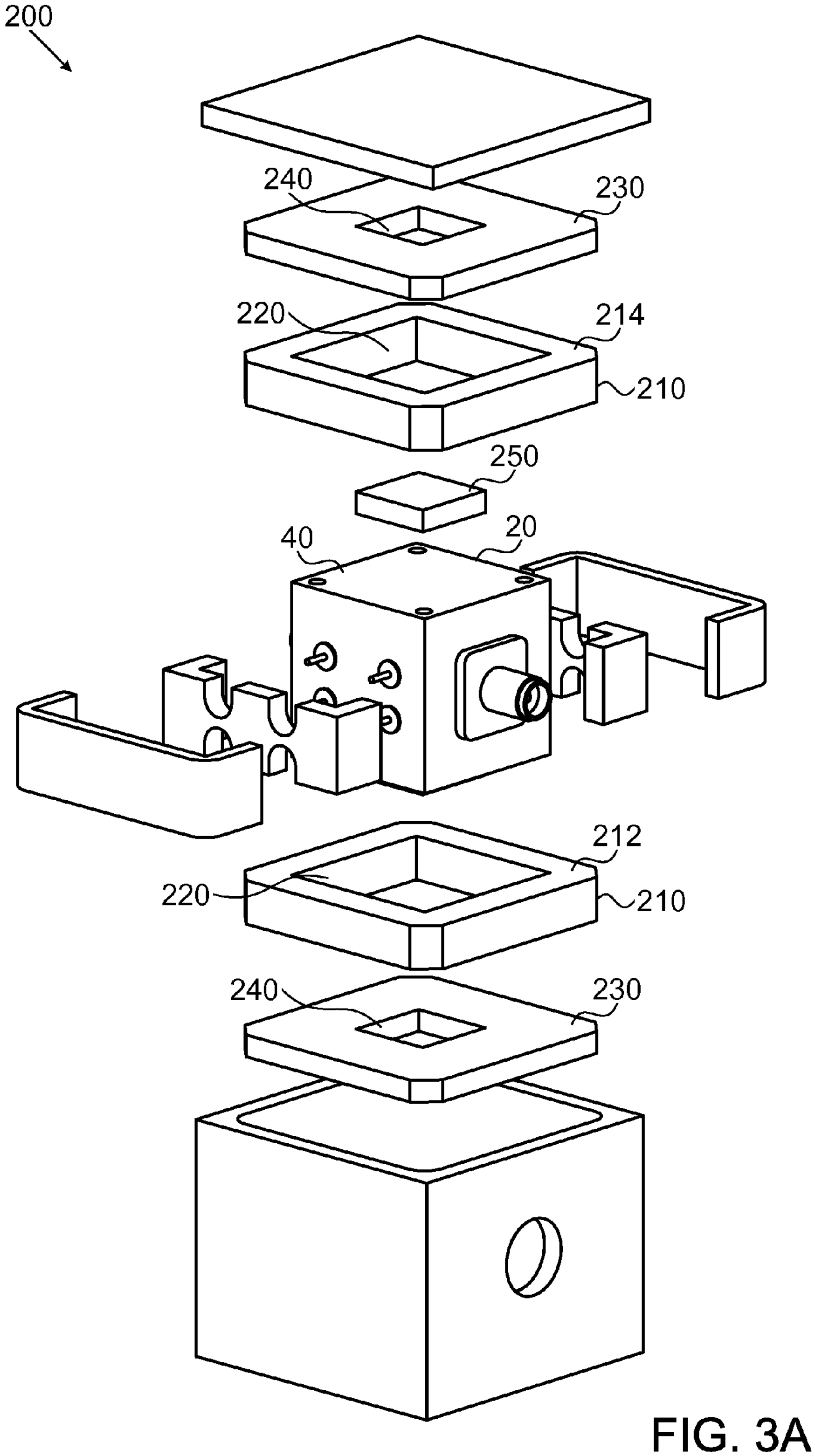
FIGS. 3A-3E illustrate various view of an exemplary embodiment of an electro-magnetic device assembly in all respects similar to FIGS. 2A-2E, wherein the mechanically isolating material is thermally conductive.
Figure 3B:
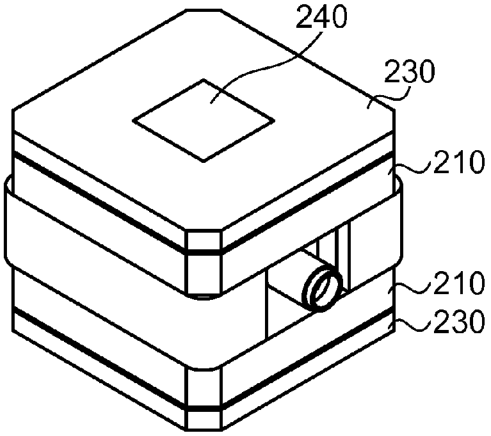
Figure 3C:
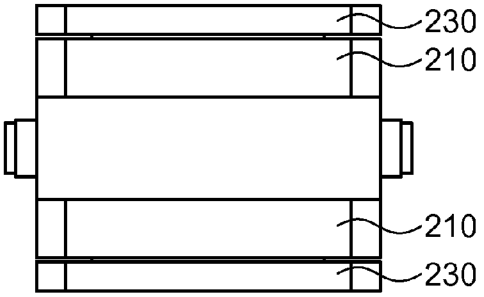
Figure 3D:
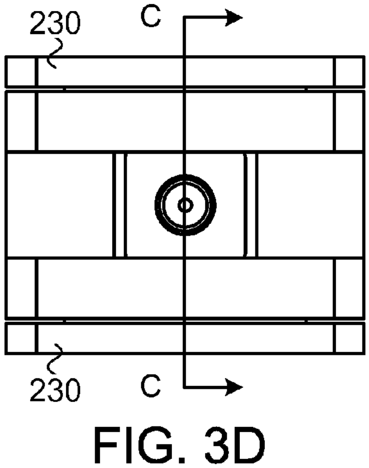
Figure 3E:
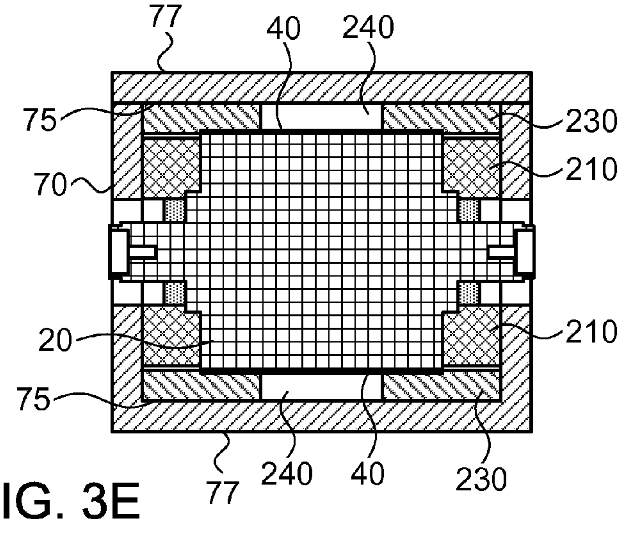

FIGS. 2A-2E illustrate various views of an exemplary embodiment of an electro-magnetic device assembly 100 comprising: an electro-magnetic device 20 exhibiting a first and a second connector 30, a first and a second face 40, a magnetic field axis 45, a first pair of side walls 47, and a second pair of side walls 48, first and second pair of side walls 47 and 48 connecting first and second face 40; a first and a second thermally conductive material 50, each exhibiting a first face 52 and a second face 54, an inset 55 and a plurality of ends 56; a first and a second mechanically isolating material 60, each exhibiting a first face 62 and a second face 64 and an inset 65; a chassis 70, exhibiting a plurality of inner walls 75 and a top and a bottom wall 77; a pair of brackets 110, exhibiting a first and a second face 120; and a plurality of electrical connections 140. Walls 77 are described as top and bottom walls 77, however this is not meant to be limiting in any way and chassis 70 can be provided in any orientation without exceeding the scope. First and second face 40 of electro-magnetic device 20 exhibit a plurality of edges 42. In further detail, FIG. 2A illustrates an exploded view of electro-magnetic device assembly 100 with chassis 70 removed, FIG. 2B illustrates an isometric view of electro-magnetic device assembly 100; FIG. 2C illustrates a side view of electro-magnetic device assembly 100 with chassis 70 removed; FIG. 2D illustrates a front view of electro-magnetic device assembly 100 with chassis 70 removed; and FIG. 2E illustrates a view of section B-B of FIG. 2E showing chassis 70, the various views of FIGS. 2A-2E being taken together for ease of understanding.

Electro-magnetic device 20 is illustrated as a box shaped device, with opposing faces 40 smaller than each of side walls 47 and 48, however this in not meant to be limiting in any way. Side walls 47 and 48 connect edges 42 of opposing faces 40. In one embodiment, pair of brackets 110 each further exhibit a plurality of channels 130 extending from first face 120 to second face 120. First and second connectors 30 appear on first pair of side walls 47 of electro-magnetic device 20, each of first pair of side walls 47 opposing each other, however this is not meant to be limiting in any way. Plurality of electrical connections 140 appear on one of second pair of side walls 48 of electro-magnetic device 20, however this is not meant to be limiting in any way. Magnetic field axis 45 is orthogonal to faces 40.

First face 120 of first bracket 110 is secured to the second wall 48 exhibiting electrical connections 140, each electrical connection 140 extending through a respective channel 130 of first bracket 110. First face 120 of second bracket 110 is secured to the second wall 48 not exhibiting electrical connections 140. In one embodiment (not shown), channels 130 are not provided for second bracket 110. In one embodiment, a portion of first face 52 of first thermally conductive material 50 is in direct contact with a first end 122 of first and second face 120 of each bracket 110. In another embodiment, a thermally conductive adhesive or gel is interposed between first end 122 of first and second face 120 of each bracket 110 and first face 52 of first thermally conductive material 50.

Ends 56 of first thermally conductive material 50 are in thermal communication with chassis 70. In one embodiment ends 56 are in direct contact with an inner wall 75 of chassis 70, and in another embodiment a thermally conductive adhesive or gel is interposed between ends 56 and inner wall 75 of chassis 70.

Heat generated by electro-magnetic device 20 is advantageously transmitted by first and second thermally conductive material 50 to chassis 70, to be dissipated thereby. In one embodiment, a majority of the heat generated by electro-magnetic device 20 is transmitted to first and second thermally conductive materials 50 via first and second brackets 110. Chassis 70 is preferably constituted of a metal secured to a heat sinking platform (not shown).

First mechanically isolating material 60, illustrated as a block with inset 65 punched from first face 62 to second face 64 thereof, without limitation, is arrayed to be in mechanical communication with second face 54 of first thermally conductive material 50 and further to be in mechanical communication with chassis 70. In one embodiment, a portion of first face 62 of first mechanically isolating material 60 is in direct contact with second face 54 of first thermally conductive material 50. In another embodiment, an adhesive, such as an acrylic adhesive, is supplied on first face 62 so as to secure first face 62 to second face 54 of first thermally conductive material 50. First thermally conductive material 50 is illustrated as a sheet with inset 55 punched from first face 52 to second face 54. Inset 55 of first thermally conductive material 50 and inset 65 of first mechanically isolating material 60 are each in one embodiment the size and shape of first face 40 of electro-magnetic device 20 and first face 40 of electro-magnetic device 20 is inserted through insets 55 and 65, first face 40 being at least partially inset from second face 64 of first mechanically isolating material 60. In another embodiment (not shown), first face 40 of electro-magnetic device 20 is flush with second face 54 of first thermally conductive material 50. In another embodiment (not shown), first face 40 of electro-magnetic device 20 is at least partially inset from second face 54 of first thermally conductive material 50.

Second face 64 of first mechanically isolating material 60 is in mechanical communication with inner wall 75 of chassis 70. In one embodiment, top wall 77 of chassis 70 is substantially parallel to first face 40 of electro-magnetic device 20, extending past the various edges of first face 40. In one embodiment second face 64 of first mechanically isolating material 60 is in direct contact with inner wall 75 of top wall 77. In another embodiment, an adhesive, such as an acrylic adhesive, is supplied on second face 64 so as to secure second face 64 to inner wall 75 of top wall 77.

Chassis 70 is formed as a container surrounding electro-magnetic device 20, thermally conductive materials 50 and mechanically isolating materials 60. Openings, as required, are made to enable contact with connectors 30 and electrical connections 140. As described above in relation to electro-magnetic device assembly 10 of FIGS. 1A-1F, electro-magnetic device assembly 100 is symmetric and for the sake of brevity the arrangement of the second half of electro-magnetic device assembly 100 will not be further described.

Vibrations experienced by chassis 70 in the direction of magnetic field axis 45 are dampened by the low compression force deflection of first and second mechanically isolating material 60, and thus vibration experienced by electro-magnetic device 20 is reduced. Each inset 65 mechanically isolates a respective face 40 from vibrations of inner wall 75 of top and bottom walls 77, as vibrations are transmitted, in a dampened format to first and second brackets 110 and from first and second brackets 110 to side walls 47 and 48. Advantageously, vibrations experienced by chassis 70 are thus transmitted to side walls 47 and 48 dampened by first and second mechanically isolating material 60, thereby not causing substantial changes to magnetic field axis 45. First and second faces 40 are advantageously isolated from direct transmission of vibrations.

FIGS. 3A-3E illustrate a plurality of views of an exemplary embodiment of an electro-magnetic device assembly 200, which is in all respects similar to electro-magnetic device assembly 100 of FIGS. 2A-2F, with the exception that: first and second thermally conductive materials 50 are replaced with a first and a second inner material 210, each exhibiting a first face 212, a second face 214 and an inset 220; first and second mechanically isolating materials 60 are replaced with a first and a second outer material 230, each exhibiting an inset 240; and electro-magnetic device assembly 200 further comprises a first and a second optional mechanically isolating material 250. In one embodiment, first and second inner materials 210 and first and second outer materials 230 are each constituted of a "gel-like" modulus material having a thermal conductivity of about 1.0 W/m-K as described above in relation to first and second thermally conductive materials 50, and further exhibit a hardness of no more than 10 durometers on the Shore A scale. First and second optional mechanically isolating material 250 each exhibit a compression force deflection at 25% deflection of less than 5 PSI, as described above in relation to mechanically isolating materials 60. The area of inset 240 of each first and second outer material 230 is in one embodiment arranged to be smaller than the area of each face 40 of electro-magnetic device 20. The size and shape of optional first and second mechanically isolating materials 250 are in one embodiment arranged to match the size and shape of insets 240 of first and second outer materials 230, so as to be inserted flush therein.

The arrangements of first and second inner materials 210 and first and second outer materials 230 are in all respects similar to the arrangements of first and second thermally conductive materials 50 and first and second mechanically isolating materials 60, respectively, with the exception that, in one embodiment, first face 40 of electro-magnetic device 20 is flush with second face 214 of first inner material 210 and in another embodiment first face 40 is at least partially inset from second face 214. In one non-limiting embodiment, each inset 240 of first and second outer material 230 is dimensioned to be directly over the central ⅓ of the respective face 40. In one embodiment, optional first and second mechanically isolating materials 250 are each placed with a first face in contact with the respective face 40 of electro-magnetic device 20, within inset 240 of the respective outer material 230, and with a second opposing face in contact with an inner wall of chassis 70, particularly in direct contact with inner wall 75 of top wall 77. In another embodiment (not shown), optional first and second mechanically isolating materials 250 are not provided.

As described above in relation to FIGS. 2A-2E, vibrations experienced by chassis 70 are absorbed by outer materials 230. Each inset 240 of first and second outer materials 230 isolates a sensitive area of the respective face 40 of electro-magnetic device 20. In the embodiment where optional first and second mechanically isolating materials 250 are provided, vibrations are absorbed and dampened thereby, thus additionally protecting the sensitive areas of the respective faces 40 of electro-magnetic device 20. As described above, heat generated by electro-magnetic device 20 is mostly absorbed by first and second inner materials 210, via the respective brackets 110 to first face 212 of each inner material 210 and is transferred to chassis 70. Advantageously, the thermal conduction properties of outer materials 230 allow for wider heat dispersion area to chassis 70.

Figure 4:
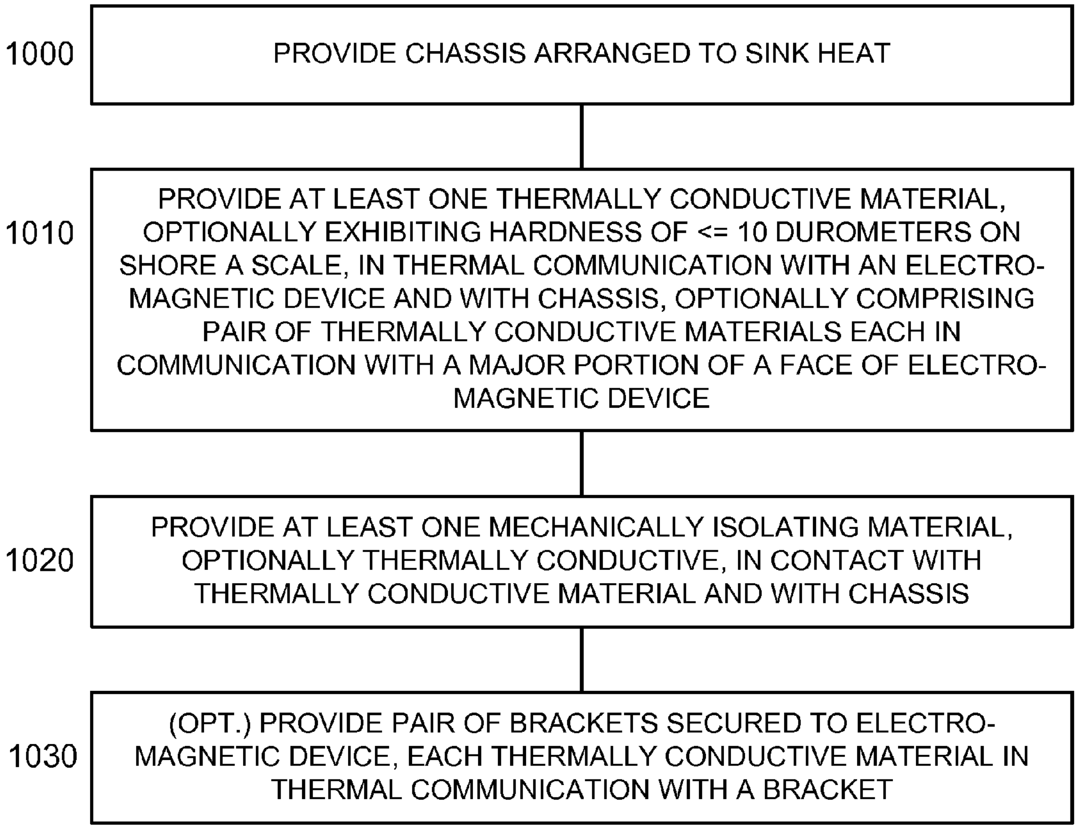
FIG. 4 illustrates a high level flow chart of a method of providing mechanical isolation and thermal conductivity for an electro-magnetic device according to certain embodiments.

FIG. 4 illustrates a high level flow chart of a method of providing mechanical isolation and thermal conductivity for an electro-magnetic device according to certain embodiments. In stage 1000, a chassis is provided, the chassis arranged to sink heat. In stage 1010, at least one thermally conductive material is provided in thermal communication with the electro-magnetic device and with the provided chassis of stage 1000. Optionally, the provided at least one thermally conductive material exhibits a hardness of no more than 10 durometers on the Shore A scale. Optionally, the provided at least one thermally conductive material comprises a pair of thermally conductive materials, each thermally conductive material in thermal communication with at least a major portion of a respective face of the electro-magnetic device. In stage 1020, at least one mechanically isolating material is provided in contact with the provided at least one thermally conductive material of stage 1010 and the provided chassis of stage 1000, thereby dampening the transmission of vibrations experienced by the provided chassis of stage 1000. Optionally, the provided at least one mechanically isolating material is thermally conductive. In optional stage 1030, a pair of brackets are provided secured to opposing side walls of the electro-magnetic device. The provided at least one thermally conductive material comprises a pair of thermally conductive materials, each in thermal communication with a respective bracket.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable subcombination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and subcombinations of the various features described hereinabove as well as variations and modifications thereof which would occur to persons skilled in the art upon reading the foregoing description and which are not in the prior art.

We claim:

1. An electro-magnetic device assembly comprising:
- an electro-magnetic device;
- a chassis arranged to sink heat;
- at least one thermally conductive material in thermal communication with said electro-magnetic device and with said chassis;
- at least one bracket secured to said electro-magnetic device, said at least one thermally conductive material in thermal communication with said electro-magnetic device via said at least one bracket; and
- at least one mechanically isolating material in mechanical communication with said thermally conductive material and with said chassis, said at least one mechanically isolating material arranged to dampen the transmission of vibrations experienced by said chassis, in the direction of the magnetic field of said electro-magnetic device, to said electro-magnetic device.

2. The electro-magnetic device assembly according to claim 1, wherein said at least one thermally conductive material exhibits a hardness of no more than 10 durometers on the Shore A scale.

3. The electro-magnetic device assembly according to claim 1, wherein said at least one mechanically isolating material is thermally conductive.

4. The electro-magnetic device assembly according to claim 1, wherein said electro-magnetic device exhibits a first face and a second face opposing said first face, and wherein said at least one thermally conductive material comprises:
- a first thermally conductive material in thermal communication with at least a major portion of said first face and with said chassis; and
- a second thermally conductive material in thermal communication with at least a major portion of said second face and with said chassis.

5. The electro-magnetic device assembly according to claim 4, wherein said chassis generally surrounds said electro-magnetic device and exhibits a first wall generally parallel with said first face of said electro-magnetic device and a second wall generally parallel with said second face of said electro-magnetic device, and wherein said at least one mechanically isolating material comprises:
- a first mechanically isolating material arranged between a portion of said first thermally conductive material and a portion of first wall of said chassis; and
- a second mechanically isolating material arranged between a portion of said second thermally conductive material and a portion of second wall of said chassis.

6. The electro-magnetic device assembly according to claim 1, wherein said at least one bracket comprises a first bracket and a second bracket, and said electro-magnetic device exhibits a first face, a second face opposing said first face, a first side wall arranged to connect a first edge of said first face to a first edge of said second face and a second side wall arranged to connect a second edge of said first face to a second edge of said second face, said second first and second walls generally parallel,
- said first bracket secured to the first side wall and in thermal communication therewith and said second bracket secured to the second side wall and in thermal communication therewith, and
- wherein said at least one thermally conductive material comprises:
  - a first thermally conductive material in thermal communication with said first bracket and with said chassis, said first thermally conductive material thereby in said thermal communication with said electro-magnetic device via said first bracket; and
  - a second thermally conductive material in thermal communication with said second bracket and with said chassis, said second thermally conductive material thereby in said thermal communication with said electro-magnetic device via said second bracket.

7. The electro-magnetic device assembly according to claim 6, wherein said chassis generally surrounds said electro-magnetic device and exhibits a first wall generally parallel with said first face of said electro-magnetic device and a second wall generally parallel with said second face of said electro-magnetic device, and wherein said at least one mechanically isolating material comprises:

a first mechanically isolating material arranged between a portion of said first thermally conductive material and a portion of the first wall of said chassis; and a second mechanically isolating material arranged between a portion of said second thermally conductive material and a portion of the second wall of said chassis.

8. A method of providing mechanical isolation and thermal conductivity for an electro-magnetic device, the method comprising:

providing the electro-magnetic device;

providing a chassis arranged to sink heat;

providing at least one thermally conductive material in thermal communication with the electro-magnetic device and with said provided chassis;

securing at least one bracket to said provided electro-magnetic device, said provided at least one thermally conductive material in thermal communication with said provided electro-magnetic device via said secured at least one bracket; and dampening the transmission of vibrations experienced by said provided chassis, in the direction of the magnetic field of the electro-magnetic device, to the electro-magnetic device by providing at least one mechanically isolating material in contact with said provided at least one thermally conductive material and with said provided chassis.

9. The method according to claim 8, wherein said provided at least one thermally conductive material exhibits a hardness of no more than 10 durometers on the Shore A scale.

10. The method according to claim 8, wherein said provided at least one mechanically isolating material is thermally conductive.

11. The method according to claim 8, wherein the said provided electro-magnetic device exhibits a first face and a second face opposing the first face, and wherein said provided at least one thermally conductive material comprises:

a first thermally conductive material in thermal communication with at least a major portion of the first face and with said chassis; and a second thermally conductive material in thermal communication with at least a major portion of the second face and with said chassis.

12. The method according to claim 11, wherein said provided chassis generally surrounds said provided electro-magnetic device, and wherein said provided chassis exhibits a first wall generally parallel with the first face of the electro-magnetic device and a second wall generally parallel with the second face of the electro-magnetic device, and wherein said provided at least one mechanically isolating material comprises:

a first mechanically isolating material arranged between a portion of said first thermally conductive material and a portion of first wall of said chassis; and a second mechanically isolating material arranged between a portion of said second thermally conductive material and a portion of second wall of said chassis.

13. The method according to claim 8, wherein said provided electro-magnetic device exhibits a first face, a second face opposing the first face, a first side wall arranged to connect a first edge of the first face to a first edge of the second face and a second side wall arranged to connect a second edge of the first face to a second edge of the second face, the first and second walls generally parallel, and wherein said secured at least one bracket comprises a first bracket and a second bracket, the method further comprising:

securing said first bracket to the first side wall of said provided electro-magnetic device and in thermal communication therewith;

securing said second bracket to the second side wall of said provided electro-magnetic device and in thermal communication therewith, and wherein said provided at least one thermally conductive material comprises:

a first thermally conductive material in thermal communication with said secured first bracket and with said provided chassis, said first thermally conductive material thereby in said thermal communication with said electro-magnetic device via said secured first bracket; and a second thermally conductive material in thermal communication with said secured second bracket and with said provided chassis, said second thermally conductive material thereby in said thermal communication with said electro-magnetic device via said secured second bracket.

14. The method according to claim 13, wherein said provided chassis generally surrounds said provided electro-magnetic device and wherein said provided chassis exhibits a first wall generally parallel with the first face of said provided electro-magnetic device and a second wall generally parallel with the second face of said provided electro-magnetic device, and wherein said at least one mechanically isolating material comprises:

a first mechanically isolating material arranged between a portion of said provided first thermally conductive material and a portion of the first wall of said provided chassis; and a second mechanically isolating material arranged between a portion of said second thermally conductive material and a portion of the second wall of said provided chassis.

* * * * *